United States Patent [19]
Gerber

[11] Patent Number: 6,130,821
[45] Date of Patent: Oct. 10, 2000

[54] MULTI-CHIP ASSEMBLY HAVING A HEAT SINK AND METHOD THEREOF

[75] Inventor: Mark Allen Gerber, Austin, Tex.

[73] Assignee: Motorola, Inc., Schaumburg, Ill.

[21] Appl. No.: 09/204,818

[22] Filed: Dec. 3, 1998

[51] Int. Cl.[7] .................................................. H05K 7/20
[52] U.S. Cl. ........................ 361/704; 361/702; 361/709; 361/710; 361/722; 257/706; 257/708; 174/16.3; 165/80.3; 165/185
[58] Field of Search .................................... 361/404, 719, 361/720, 728, 703, 707, 709, 712, 722, 690, 689, 702; 257/706, 707, 713, 718, 719, 723; 174/16.3, 52.1; 165/80.3, 185, 80.4; 439/485, 487; 24/458, 472, 625; 248/316.7, 505, 510

[56] References Cited

U.S. PATENT DOCUMENTS

| | | | |
|---|---|---|---|
| 4,169,642 | 10/1979 | Mouissie | 339/17 F |
| 4,563,725 | 1/1986 | Kirby | 361/388 |
| 4,674,005 | 6/1987 | Lacz | 361/388 |
| 4,745,456 | 5/1988 | Clemens | 357/79 |
| 5,109,318 | 4/1992 | Funari et al. | 361/388 |
| 5,323,845 | 6/1994 | Lu | 165/80.3 |
| 5,381,305 | 1/1995 | Harmon et al. | 361/704 |
| 5,615,735 | 4/1997 | Yoshida et al. | 165/80.3 |

*Primary Examiner*—Leo P. Picard
*Assistant Examiner*—Michael Datskovsky
*Attorney, Agent, or Firm*—Lee E. Chastain

[57] ABSTRACT

A multi-chip assembly (100) uses a clip (110) to retain multiple integrated circuits (124–130) to an assembly substrate (140). The use of a thermal medium between the integrated circuits and the heat sinks (120, 122) allows the assembly to be disassembled for rework purposes. The clip contains edge clamps (112), alignment rails (114), and alignment features (116, 316, 416) to properly orient the clip, heat sink, integrated circuits, and assembly substrate.

14 Claims, 3 Drawing Sheets

MULTI-CHIP ASSEMBLY HAVING A HEAT SINK AND METHOD THEREOF

FIELD OF THE INVENTION

The present invention relates generally to the use of heat sinks, and more specifically to multi-chip module integrated circuits using heat sinks.

BACKGROUND OF THE INVENTION

As integrated circuits increase in speed, the necessity to remove heat from these devices becomes increasingly important to assure proper operation. The use of heat sinks to dissipate heat from integrated circuits is well known, however, as advances in semiconductor technology results in increased speed and reduced chip size, the problems associated with the use of heat sinks can compound.

For example, one trend with modern integrated circuits is to use multi-chip modules. Multi-chip modules (MCM) attach multiple integrated circuits to a single substrate in order to save space and allow for user upgrades. One solution for dissipating heat from a MCM has been to attach heat sinks using an epoxy based adhesive. A problem with the use of epoxy based adhesives is that the permanent characteristics of the epoxy limit traceability of individual integrated circuits by lot markings on the top of the device. As a result, the tracking of failures and failure mechanisms in the production of MCMs products becomes difficult.

Another problem with the use of epoxy based methods is that the use of such adhesive processes is costly, specifically because of long oven cure times. Generally, 2 to 24 of cure time is needed to attach a heat sink to a integrated circuit when using an epoxy based adhesive.

Yet another problem associated with the use of epoxy attach methods is the mismatch of thermal coefficients of expansions (TCE) between the heat sink, the integrated circuit, and the underlying substrate. As a result of the mismatched TCEs, it is possible for a heat sink or integrated circuit to delaminate from the epoxy/glue.

Therefore, it would be desirable to identify a method and apparatus that overcomes these problems.

It should be understood that the figures are not necessarily drawn to scale and that variations, between dimensions and relationships of the components, can occur.

DETAILED DESCRIPTION OF THE DRAWINGS

Figure 1:
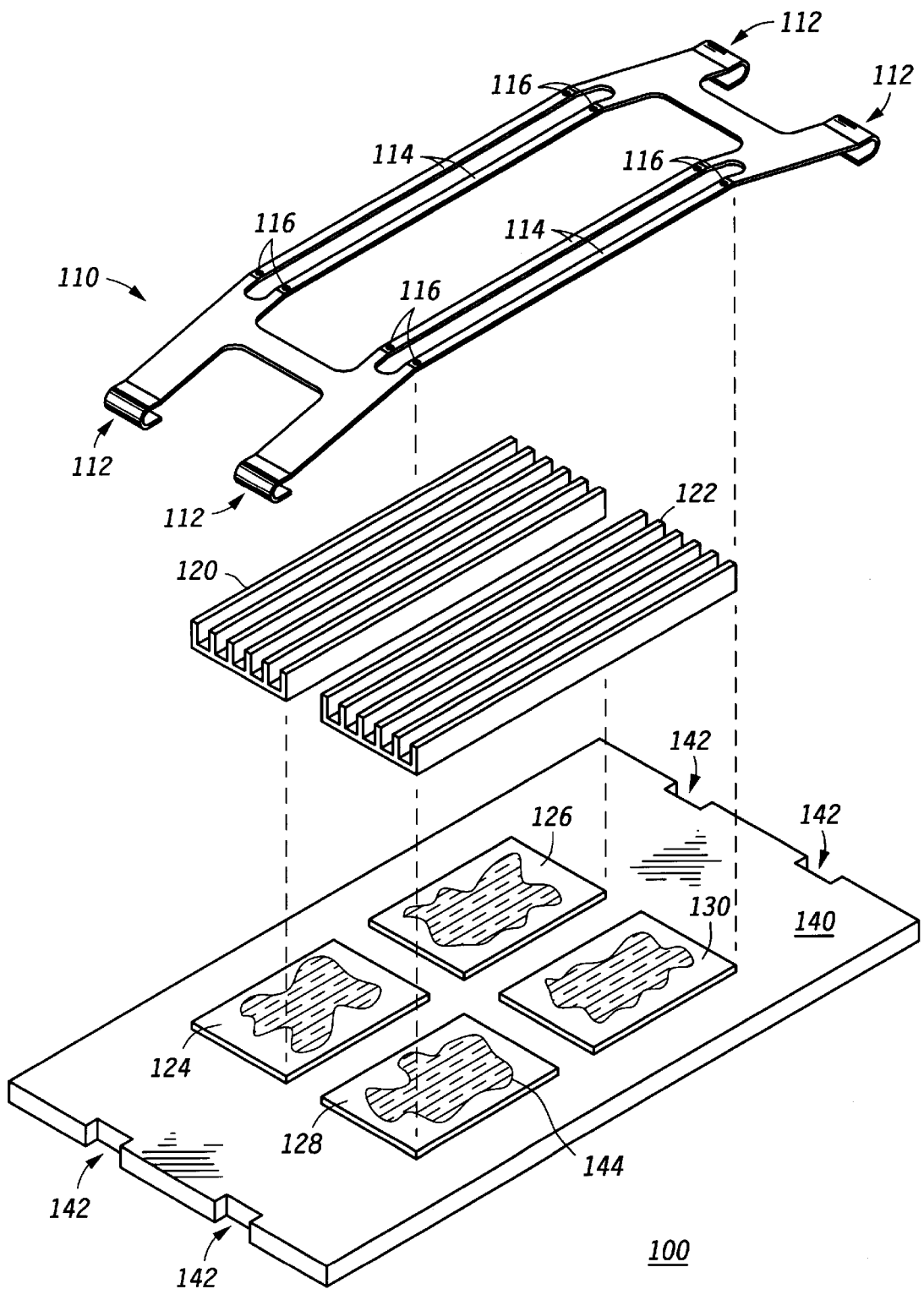
FIG. 1 illustrates an exploded isometric view of a multi-chip assembly using a heat sink.

FIG. 1 illustrates a multi-chip assembly 100 which includes a clip 110, heat sinks 120, 122, and an assembly substrate 140 to which integrated circuit devices 124, 126, 128, and 130 are attached.

The integrated circuits 124, 126, 128, and 130 are attached to the assembly substrate 140 using a conventional solder reflow process. The specific integrated circuits 124–130 can comprise any package type including, but not limited to, plastic packages, ceramic packages, ball grid arrays (BGA), flip-chip ball grid arrays (FC-BGA), flip-chip devices, and chip scale package devices.

The assembly substrate 140 also has recessed regions 142 which are edge clamp notches 142 used to position the clip 110 onto the assembly substrate 140. In the specific embodiment shown, the edge clamp notches 142 are illustrated as being on the non-connector side of the multi-chip assembly. However, in other embodiments it would be possible to have a connector which would accommodate the edge clamp notches 142 on the connector sides or on all four sides. The use of edge clamp notches 142 represents an advantage over the prior art in that the edge clamp notches require a minimal amount of assembly substrate 140 space, therefore, it is possible to maintain high density routing within the assembly substrate 140. In other embodiments, it is possible to have a single edge clamp 112 and, thus, a single edge clamp notch.

Next in the assembly process, a thermal medium 144 is placed upon each of the integrated circuits 124–130. The thermal medium 144 can also be placed upon the underside of the heat sinks 120 and 122 or on top of the individual integrated circuits. In operation, the thermal medium 144 operates to form a reliable thermal contact between the integrated circuits and the heat sinks 120 and 122. The amount of thermal medium applied will be determined, based upon the coplanarity of the integrated circuits 124–130. For instance, if the assembly process can guarantee a coplanarity between the integrated circuits 124–130 upon the assembly substrate 140 of 254 microns, then a thermal medium 144 thickness of at least 254 microns is necessary to assure appropriate contact between the heat sinks 120, 122 and the underline integrated circuits 124–130.

Any number of appropriate thermal medium can be used. Examples would include thermal grease, such as Wakefield "120" thermal grease or thermal tape such as Chomerics "Thermattach T410" tape thermal interface material. It is preferred that the characteristics of the thermal medium do not break down over time, thereby ensuring proper cooling of integrated circuits 124–130.

Heat sinks 120 and 122 are then placed in contact with the integrated circuits 124–130. Their contact with the integrated circuits 124–130 through the thermal medium 144 assures the ability of the multi-chip assembly to remove heat from the integrated circuits. In the specific embodiment, the heat sinks 120 and 122 are illustrated to be fin type heat sinks. In other embodiments, it would be possible for post type heat sinks to be used, a circular fin heat sink or even a simple rectangular thermal mass heat sink capable of removing heat could be used as well.

The clip 110 provides a compressive force between the heat sinks 122 and the underlying integrated circuits 124–130. This force is accomplished by the elastic or spring properties of the clip material and through its shape relative to the shape of the multi-chip assembly. In one embodiment, clip 110 is fabricated from stainless steel. Other materials, such as plastics and other metals, may be used. Also, edge clamps 112 form an angle slightly more than 180° (as viewed form above the clip) with alignment rails 114. This angle creates a space slightly smaller than the height of the heat sink and integrated circuits. One skilled in the art, in conjunction with the instant application, can modify the shape and materials of clip 110 to suit a wide variety of multi-chip assembly dimensions.

Figure 3:
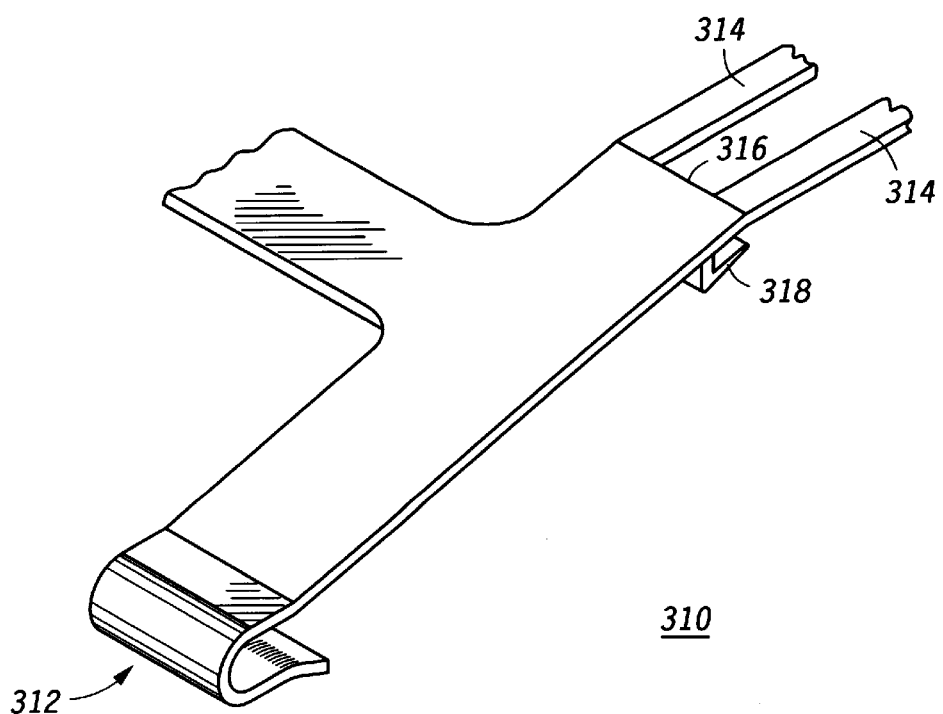
FIG. 3 illustrates a detailed view of a portion of the clip of FIG. 1.

The specific embodiment of the clip 110 illustrates alignment rails 114 which would be machined to fit within the specific grooves of heat sinks 120 and 122. These alignment rails provide alignment of the heat sinks 120, 122 to the integrated circuits 124–130 and to assembly substrate 140 through the connection of the heat sinks to the edge clamp notches 144. These alignment rails prevent movement of heat sinks 120, 122 in a direction orthogonal to the length of the alignment rails. In addition, alignment features 116 are also illustrated on the clip 110. In one embodiment, the alignment features 116 constitute punch-through notches. Alignment features 116 prevent movement of heat sinks 120, 122 in a direction parallel to the length of the alignment rails. It should be understood that many additional types of alignment features are possible. FIG. 3 depicts a second type of alignment feature.

Figure 2:
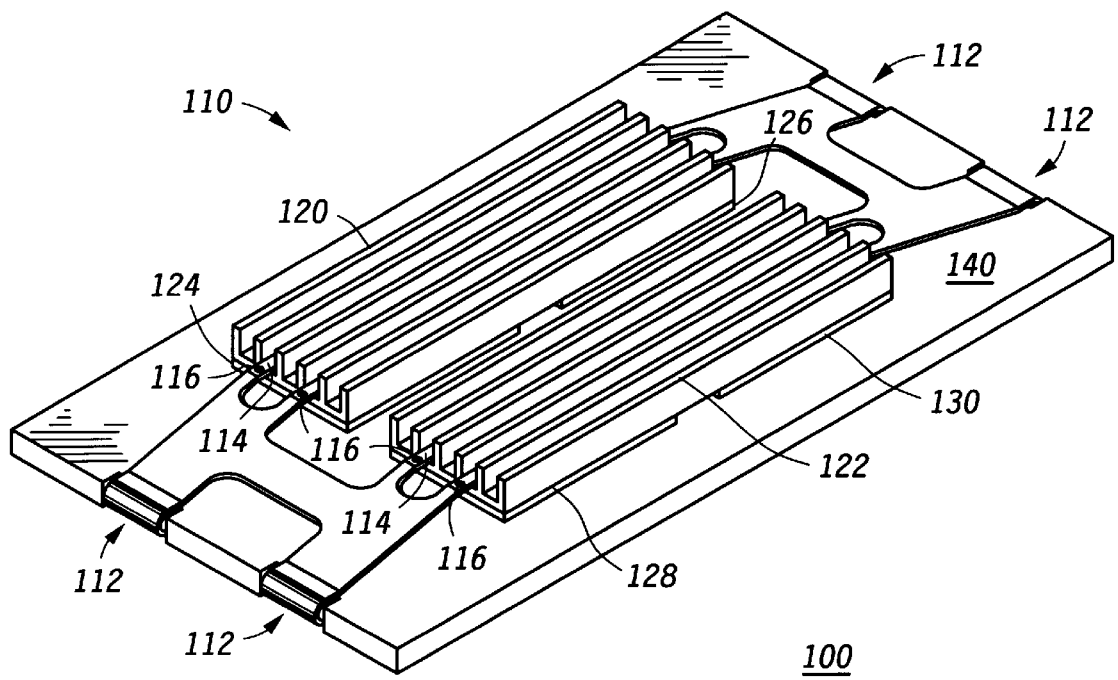
FIG. 2 illustrates a collapsed view of FIG. 1.

FIG. 2 illustrates the collapsed view of the multi-chip assembly 100 illustrated in FIG. 1. Here, clip 110 is attached via edge clamps 112 to assembly substrate 140. As described above, the shape and material of clip 110 generates a compressive force between heat sinks 120, 122 and integrated circuits 124–130. Edge clamp notches 142 prevent clip 100 from moving relative to assembly substrate 140. Furthermore, alignment rails 114 and alignment features 116 prevent heat sinks 120, 122 from moving relative to integrated circuits 124–130. Although securely assembled, multi-chip assembly 100 can be easily disassembled for service or inspection. As described above, there is no permanent bonding of clip 110 to integrated circuits 124–130.

FIG. 3 illustrates a second embodiment of a clip 310. Clip 310 contains another alignment feature and two aides to manufacturing. As in FIG. 1, an edge clamp 312 connects clamp 310 to an assembly substrate. A pair of alignment rails 314 are connected to edge clamp 312 and to another symmetrical edge clamp (not shown). Here, however, movement of heat sinks 120, 122 along the length of alignment rails 314 is prevented by an alignment edge 316. The junction of (1) the end of alignment rails 314 and (2) edge clamp 312 forms alignment edge 316.

Clip 310 illustrates a pre-assembly fastener 318. Pre-assembly faster 318 is an "L" shaped extension of alignment edge 316. Pre-assembly fastener 318 extends downwards out of the plane formed by alignment rails 314. The length of pre-assembly fastener 318 places its base at a position below alignment rails 314 such that the base engages the bottom of a heat sink in a compressive manner when the heat sink is mounted flush against the rails. Pre-assembly fastener 318 allows a manufacturer to attach heat sinks 120, 122 to clip 110 prior to the clip being mounted onto the assembly substrate 140. This pre-assembly improves manufacturability of the multi-chip assembly 100. Also, the open end of edge clamp 312 flares away from the body of the clamp. This flare allows clip 310 to be more easily attached and removed from assembly substrate 140.

Figure 4:
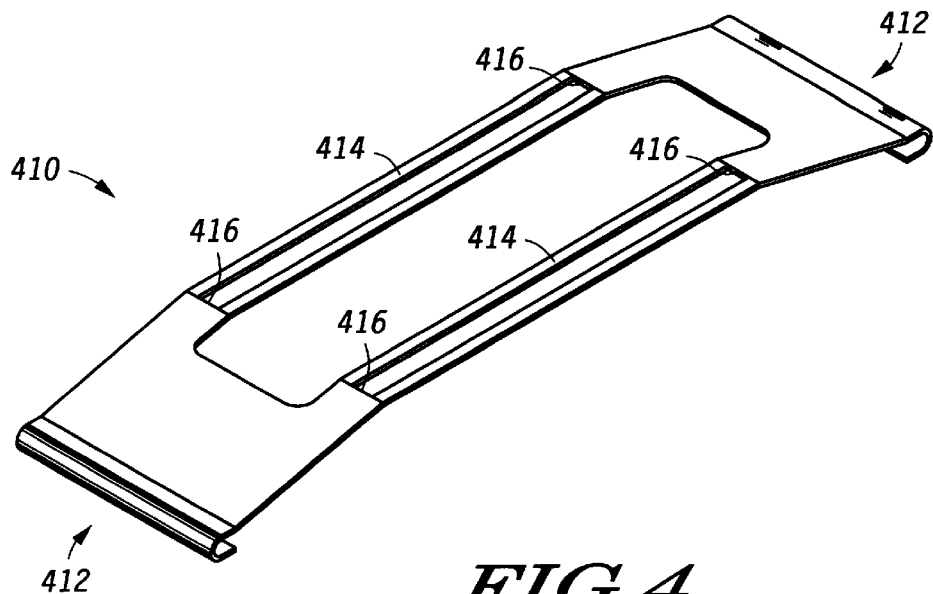
FIG. 4 illustrates yet another embodiment of the clip of FIG. 1.

FIG. 4 illustrates yet another embodiment of the present invention, where the edge clamps 412 is a monolithic clamp, as opposed to the dual clamps 112 illustrates in FIG. 1. In this embodiment, the assembly substrate, not shown, would have an edge clamp notch that was also monolithic such that it would receive the monolithic edge clamp 412. In addition, clip 410 no longer has the alignment features 116, but instead has alignment features 416 which represent alignment edges. In other words, the opening formed by the alignment rails 414 would be machined to receive one of the fins of the heat sinks (now shown) such that it was positioned in a fixed manner relative to the underline assembly module and integrated circuits.

Figure 5:
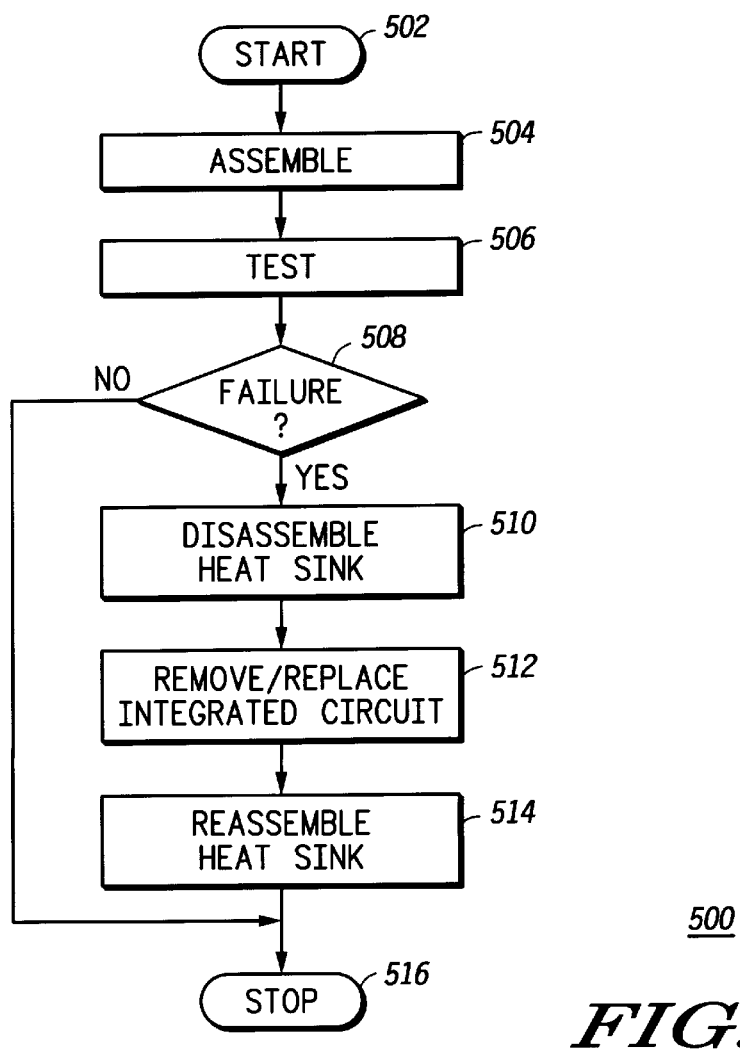
FIG. 5 illustrates a flow diagram of a method of reworking the multi-chip assembly depicted in FIGS. 1 and 2.

FIG. 5 illustrates a flow diagram of a method of reworking the multi-chip assembly depicted in FIGS. 1 and 2. Specifically, the multi-chip assembly such as discussed with reference to FIG. 1, is assembled at step 504. At step 506, a testing procedure is applied to a multi-chip assembly. At step 508, a determination is made whether or not the testing procedure of step 506 resulted in a failure being detected. If no failure has been detected, the flow proceeds to step 516 and stop. However, if a failure is detected at step 508 the flow proceeds to step 510. At step 510, a disassembly occurs. During the dis-assembly step 510, the clip 110 is removed from the underline substrate 144, the heat sinks 120, 122 are removed. With the heat sinks 120, 122 removed the lot numbers or other identifying information can be readily obtained from the devices 124–130. At step 512, the failed integrated circuit, for example device 128, can be removed and replaced. This rework procedure is cost effective in that individual devices can be replaced and lot information identified to allow tracking of errors. Subsequent to the rework step 512, re-assembly occurs at step 514. Subsequently steps 506 through 514 can be repeated.

It should be understood that in other embodiments, the assembly rails could be modified so that a force is applied to different portions of the heat sink. For instance, the clamp could couple to the top of one or more heat sink fins. In addition, other alignment mechanisms can be used to restrict movement of the attached heat sink.

The multi-chip assembly illustrated has several advantages over the prior art. First, by attaching the clamp 110 to the edge of the underlying assembly substrate 140, the substrate real estate dedicated to the clamp is minimized. The present invention also minimizes the effect of varying thermal coefficients of expansion between the assembly substrate 140, the heat sinks 122, 120, and the clip 110. This minimization results in increased reliability of the multi-chip assembly. The use of thermal medium and removable clamp allows a multi-chip assembly to be easily disassembled and reworked if necessary. Further, a single heat sink can be used to contact multiple dies and without the use of a special device socket, thereby reducing costs. Another advantage of using a single heat sink is its greater thermal mass. A larger thermal mass dissipates a greater amount of heat from the integrated circuits to which it is attached. This is particularly advantageous if one of the two die sharing a common heat sink dissipates more heat than the other. In this situation, the increased thermal mass of the larger heat sink will be beneficial to the overall system because the die which is dissipating more heat will be able to do so more efficiently.

What is claimed is:

1. A multi-chip assembly comprising:
    an assembly substrate;
    a plurality of integrated circuits mounted on the assembly substrate;
    a heat sink disposed on the plurality of integrated circuits; and
    a clip for clamping the heat sink to the plurality of integrated circuits, the clip including
        at least one edge clamp for coupling to the assembly substrate; and
        at least one alignment feature for limiting movement of the heat sink in a first direction, the first direction being toward the at least one edge clamp, wherein the alignment feature is different than the at least one edge clamp.

2. The multi-chip assembly of claim 1 wherein the at least one edge clamp is for engaging an edge of the assembly substrate.

3. The multi-chip assembly of claim 1 wherein the clip further comprises at least one alignment feature for limiting movement of the heat sink in a second direction.

4. The multi-chip assembly of claim 3 wherein the clip further comprises at least one pre-assembly fastener for attaching the heat sink to the clip.

5. The multi-chip assembly of claim 4 further comprising a medium disposed between the heat sink and the plurality of integrated circuits, the medium selected from the set consisting of thermal grease and thermal tape.

6. The multi-chip assembly of claim 1 wherein the clip further comprises at least one alignment feature for limiting movement of the heat sink in a second direction.

7. The multi-chip assembly of claim 6 wherein the clip further comprises at least one pre-assembly fastener for attaching the heat sink to the clip.

8. The multi-chip assembly of claim 7 further comprising a medium disposed between the heat sink and the plurality of integrated circuits, the medium selected from the set consisting of thermal grease and thermal tape.

9. The multi-chip assembly of claim 1 wherein the clip further comprises at least one pre-assembly fastener for attaching the heat sink to the clip.

10. The multi-chip assembly of claim 9 further comprising a medium disposed between the heat sink and the plurality of integrated circuits, the medium selected from the set consisting of thermal grease and thermal tape.

11. The multi-chip assembly of claim 1 further comprising a medium disposed between the heat sink and the plurality of integrated circuits, the medium selected from the set consisting of thermal grease and thermal tape.

12. The multi-chip assembly of claim 1 wherein the clip further comprises:
- a first edge clamp for engaging a first edge of the assembly substrate;
- a first pair of alignment rails, the alignment rails of the first pair disposed generally parallel to each other, a first end of each of the first pair of alignment rails attached to the first edge clamp;
- a second pair of alignment rails, the alignment rails of the second pair disposed generally parallel to each other, a first end of each of the second pair of alignment rails attached to the first edge clamp;
- a second edge clamp for engaging a second edge of the assembly substrate rails, a second end of each of the first and second pair of alignment rails attached to the second edge clamp.

13. A multi-chip assembly comprising:

an assembly substrate;

a first integrated circuit mounted on the assembly substrate;

a first heat sink disposed on the first integrated circuit;

a second integrated circuit mounted on the assembly substrate;

a second heat sink disposed on the second integrated circuit; and a clip coupled to the first heat sink and to the second heat sink for clamping the first heat sink to the first integrated circuit and for clamping the second heat sink to the second integrated circuit, wherein the clip includes at least one pre-assembly fastener for attaching at least the first heat sink to the clip.

14. A multi-chip assembly comprising:

an assembly substrate;

a plurality of integrated circuits mounted on the assembly substrate;

a heat sink disposed on the plurality of integrated circuits; and a clip clamped to the heat sink for clamping the heat sink to the plurality of integrated circuit wherein the clip includes at least one preassembly fastener for attaching the heat sink to the clip.

\* \* \* \* \*